(12) United States Patent
Ryu et al.

(10) Patent No.: US 10,796,915 B2
(45) Date of Patent: Oct. 6, 2020

(54) METHOD FOR FORMING EPITAXIAL LAYER AT LOW TEMPERATURE

(71) Applicant: EUGENE TECHNOLOGY CO., LTD., Yongin-si, Gyeonggi-do (KR)

(72) Inventors: Doo Yeol Ryu, Cheongju-si (KR); Seung Woo Shin, Hwaseong-si (KR); Cha Young Yoo, Suwon-si (KR); Woo Duck Jung, Suwon-si (KR); Ho Min Choi, Yongin-si (KR); Wan Suk Oh, Icheon-si (KR); Hui Sik Kim, Yongin-si (KR); Eun Ho Kim, Yongin-si (KR); Seong Jin Park, Seoul (KR)

(73) Assignee: EUGENE TECHNOLOGY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 16/346,683

(22) PCT Filed: Aug. 14, 2017

(86) PCT No.: PCT/KR2017/008855
§ 371 (c)(1),
(2) Date: May 1, 2019

(87) PCT Pub. No.: WO2018/084409
PCT Pub. Date: May 11, 2018

(65) Prior Publication Data
US 2019/0304785 A1    Oct. 3, 2019

(30) Foreign Application Priority Data

Nov. 3, 2016 (KR) .................. 10-2016-0146049

(51) Int. Cl.
*H01L 21/20* (2006.01)
*H01L 21/203* (2006.01)
(Continued)

(52) U.S. Cl.
CPC .......... *H01L 21/2018* (2013.01); *H01L 21/02* (2013.01); *H01L 21/20* (2013.01);
(Continued)

(58) Field of Classification Search
CPC ...... H01L 21/02; H01L 21/0206; H01L 21/20
See application file for complete search history.

(56) References Cited

U.S. PATENT DOCUMENTS

| 6,429,084 B1 | 8/2002 | Park et al. |
| 9,243,329 B2 | 1/2016 | Dietz |

(Continued)

FOREIGN PATENT DOCUMENTS

| KR | 10-2003-0008992 A | 1/2003 |
| KR | 10-2014-0039544 A | 4/2014 |

(Continued)

*Primary Examiner* — Caridad Everhart
*Assistant Examiner* — Ankush K Singal
(74) *Attorney, Agent, or Firm* — Rabin & Berdo, P.C.

(57) ABSTRACT

Provided is a method for forming an epitaxial layer at a low temperature. The method for forming the epitaxial layer includes transferring a substrate into an epitaxial chamber and performing an epitaxial process on the substrate to form an epitaxial layer on the substrate. The epitaxial process includes heating the substrate at a temperature of about 700° C. or less and injecting a silicon gas into the epitaxial chamber in a state in which the inside of the epitaxial chamber is adjusted to a pressure of about 300 Torr or less to form a first epitaxial layer, stopping the injection of the silicon gas and injecting a purge gas into the epitaxial chamber to perform first purge inside the epitaxial chamber, heating the substrate at a temperature of about 700° C. or less and injecting the silicon gas into the epitaxial chamber in the state in which the inside of the epitaxial chamber is adjusted to a pressure of about 300 Torr or less to form a second epitaxial layer, and stopping the injection of the (Continued)

silicon gas and injecting the purge gas into the epitaxial chamber to perform second purge inside the epitaxial chamber.

5 Claims, 9 Drawing Sheets

(51) Int. Cl.
    *H01L 21/324*     (2006.01)
    *H01L 21/285*     (2006.01)
    *H01L 21/02*     (2006.01)

(52) U.S. Cl.
    CPC .......... *H01L 21/203* (2013.01); *H01L 21/285* (2013.01); *H01L 21/324* (2013.01)

(56) References Cited

U.S. PATENT DOCUMENTS

| | | | |
|---|---|---|---|
| 2008/0135516 A1* | 6/2008 | Yokogawa | C30B 29/06 216/37 |
| 2008/0182397 A1* | 7/2008 | Lam | H01L 21/02532 438/607 |
| 2014/0084369 A1* | 3/2014 | Murthy | H01L 29/7834 257/344 |
| 2014/0087537 A1 | 3/2014 | Kim et al. | |
| 2016/0087104 A1 | 3/2016 | Lee et al. | |

FOREIGN PATENT DOCUMENTS

| | | |
|---|---|---|
| KR | 10-2016-0035650 A | 4/2016 |
| WO | WO 2016-069180 A1 | 5/2016 |

\* cited by examiner

METHOD FOR FORMING EPITAXIAL LAYER AT LOW TEMPERATURE

TECHNICAL FIELD

The present invention relates to a method for forming an epitaxial layer on a substrate, and more particularly, to a method for forming an epitaxial layer at a low temperature.

BACKGROUND ART

Semiconductor devices are manufactured by using various types of unit processes. Among the unit processes, a selective epitaxial layer formation process is being widely used in the manufacture of highly integrated semiconductor devices. The selective epitaxial layer formation process is a process of forming a semiconductor layer on a predetermined area of a semiconductor substrate such as a silicon substrate. The selective epitaxial layer formation process is being widely used to form a contact plug of the semiconductor device, raised source/drain regions of a MOS transistor, or a body layer of a single crystal thin film transistor.

A method for forming raised source/drain regions using a selective epitaxial layer formation process has been disclosed in U.S. Pat. No. 6,429,084 B1 entitled "MOS transistors with raised sources and drains" by Park et al. According to Park et al., the selective epitaxial growth process is performed at a high temperature of about 750° C. to about 850° C.

The selective epitaxial layer formation process, which has been well known until now, has been mainly performed by using a low pressure chemical vapor deposition technique (LPCVD technique). Such a low pressure chemical vapor deposition selective epitaxial layer formation process (LPCVD SEG process) is performed at a high temperature of about 750° C. to about 850° C. as disclosed in abovementioned U.S. Pat. No. 6,429,084 B1. Thus, when the LPCVD SEG process is used to manufacture a highly integrated semiconductor device, there is a limit to suppress a short channel effect of the MOS transistor.

Furthermore, the LPCVD SEG process is performed under a pressure of about 10 Torr to about 20 Torr. In this case, atoms thermally decomposed from a semiconductor source gas and a selective etch gas, which are used in the LPCVD SEG process has a short mean free path of several mm or less under a pressure of about 10 Torr to about 20 Torr. As a result, a growth rate and a selective etch rate of the epitaxial layer may be non-uniform over all semiconductor substrates loaded into a reactor or on an entire surface of each of the semiconductor substrates. Thus, in the LPCVD SEG process, the semiconductor source gas and the selective etch gas have to be supplied together with a carrier gas such as a hydrogen gas.

Although the LPCVD SEG process is performed by using a single wafer type chamber, the carrier gas (the hydrogen gas) is injected into the single wafer type chamber at a high flow rate of at least 20,000 sccm (standard cubic centimeter per minute). In this case, hydrogen atoms decomposed from the hydrogen gas may be bonded to dangling bonds on the surface of the semiconductor substrate to deteriorate the growth rate of the epitaxial layer and/or the uniformity of the growth rate of the epitaxial layer.

DISCLOSURE

Technical Problem

The present invention provides a method for forming an epitaxial layer at a low temperature of about 700° C. or less.

Another object of the present invention will become evident with reference to following detailed descriptions and accompanying drawings.

TECHNICAL SOLUTION

In one embodiment, a method for forming an epitaxial layer includes: transferring a substrate into an epitaxial chamber; and performing an epitaxial process on the substrate to form an epitaxial layer on the substrate, wherein the epitaxial process includes: heating the substrate at a temperature of about 700° C. or less and injecting a silicon gas into the epitaxial chamber in a state in which the inside of the epitaxial chamber is adjusted to a pressure of about 300 Torr or less to form a first epitaxial layer; stopping the injection of the silicon gas and injecting a purge gas into the epitaxial chamber to perform first purge inside the epitaxial chamber; heating the substrate at a temperature of about 700° C. or less and injecting the silicon gas into the epitaxial chamber in the state in which the inside of the epitaxial chamber is adjusted to a pressure of about 300 Torr or less to form a second epitaxial layer; and stopping the injection of the silicon gas and injecting the purge gas into the epitaxial chamber to perform second purge inside the epitaxial chamber.

The silicon gas may include at least one of $SiCl_4$, $SiHCl_3$, $SiH_2Cl_2$, $SiH_3Cl$, $Si_2H_6$, and $SiH_4$.

The epitaxial process may further include: heating the substrate at a temperature of about 700° C. or less and injecting the silicon gas into the epitaxial chamber in the state in which the inside of the epitaxial chamber is adjusted to a pressure of about 300 Torr or less to form an n-th epitaxial layer; and stopping the injection of the silicon gas and injecting the purge gas into the epitaxial chamber to perform n-th purge inside the epitaxial chamber (where n=3, 4, . . . k, and k is an integer).

In the forming of the first and second epitaxial layers, the substrate may be heated at a temperature of about 480° C., and in the epitaxial process, the epitaxial layer having a thickness that is greater than about 60 Å and less than about 74 Å may be formed on the substrate.

In the forming of the first and second epitaxial layers, the substrate may be heated at a temperature of about 500° C., and in the epitaxial process, the epitaxial layer having a thickness that is greater than about 62 Å and less than about 115 Å may be formed on the substrate.

In the forming of the first and second epitaxial layers, the substrate may be heated at a temperature of about 520° C., and in the epitaxial process, the epitaxial layer having a thickness that is greater than about 71 Å and less than about 110 Å may be formed on the substrate.

Advantageous Effects

According to the embodiment of the present invention, the epitaxial layer may be formed at the low temperature of about 700° C. or less.

BEST MODE

Figure 1:
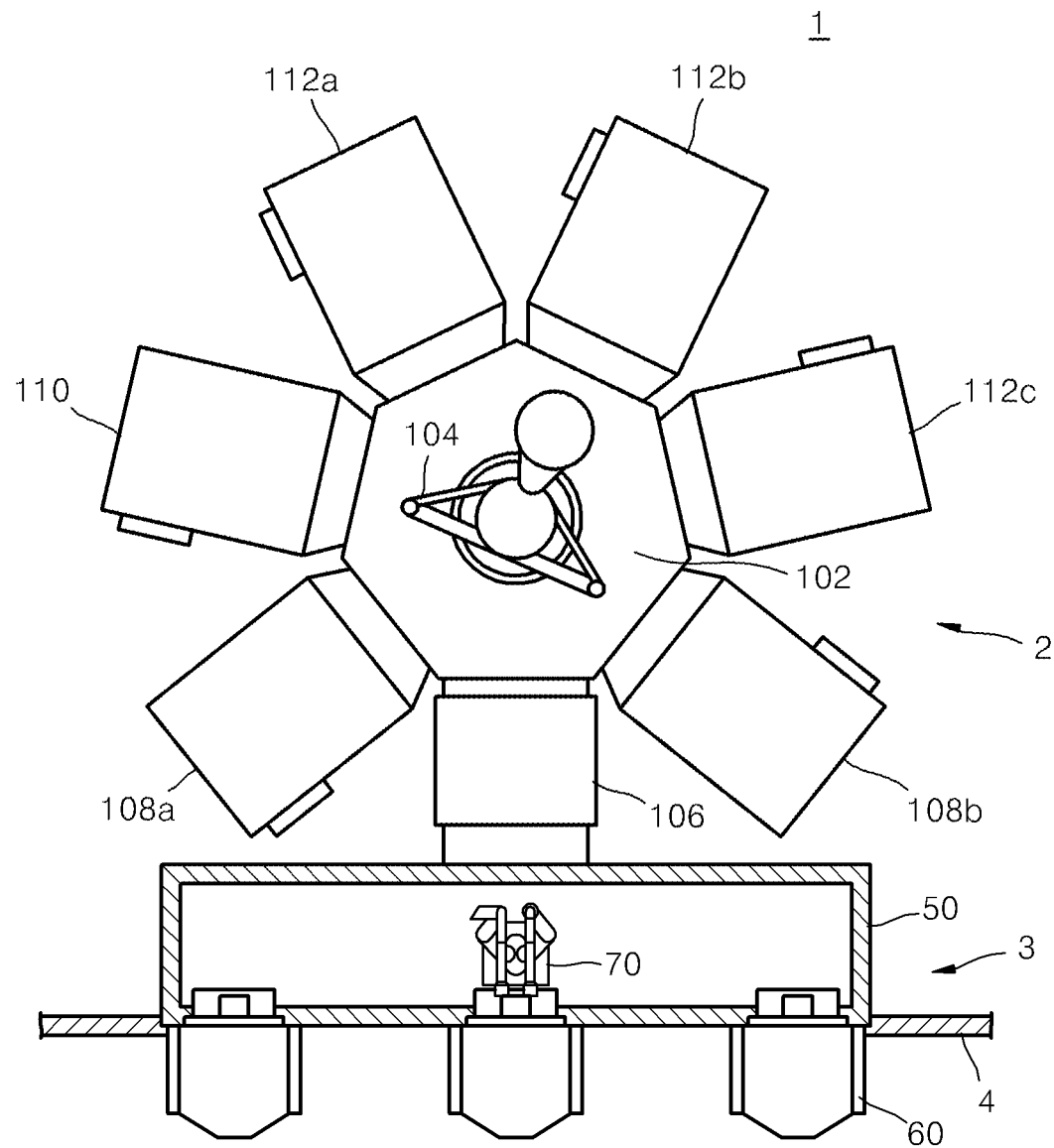
FIG. 1 is a schematic view of semiconductor manufacturing equipment according to an embodiment of the present invention.

Hereinafter, exemplary embodiments of the present invention will be described in detail with reference to FIGS. 1 to 10. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the shapes of components are exaggerated for clarity of illustration.

FIG. 1 is a schematic view of semiconductor manufacturing equipment 1 according to an embodiment of the present invention. The semiconductor manufacturing equipment 1 includes process equipment 2, an equipment front end module (EFEM) 3, and an interface wall 4. The EFEM 3 is mounted on a front side of the process equipment 2 to transfer a wafer W between a container (not shown) in which substrates S are received and the process equipment 2.

The EFEM 3 includes a plurality of loadports 60 and a frame 50. The frame 50 is disposed between the loadports 60 and the process equipment 2. The container in which the substrates S are received is placed on the loadports 60 by a transfer unit (not shown) such as an overhead transfer, an overhead conveyor, or an automatic guided vehicle.

An airtight container such as a front open unified pod (FOUP) may be used as the container. A frame robot 70 for transferring the substrates S between the container placed on the loadports 60 and the process equipment 2 is disposed within the frame 50. A door opener (not shown) for automatically opening or closing a door of the container may be disposed within the frame 50. Also, a fan filter unit (FFU) (not shown) for supplying clean air into the frame 50 may be provided within the frame 50 so that the clean air flows downward from an upper side within the frame 50.

A predetermined process with respect to each of the substrates S is performed within the process equipment 2. The process equipment 2 includes a transfer chamber 102, a loadlock chamber 106, cleaning chambers 108a and 108b, a buffer chamber 110, and epitaxial chambers (or epitaxial apparatuses) 112a, 112b, and 112c. The transfer chamber 102 may have a substantially polygonal shape when viewed from an upper side. The loadlock chamber 106, the cleaning chambers 108a and 108b, the buffer chamber 110, and the epitaxial chambers 112a, 112b, and 112c are disposed on side surfaces of the transfer chamber 102.

The loadlock chamber 106 is disposed on a side surface adjacent to the EFEM 3 among the side surfaces of the transfer chamber 102. The substrate S is loaded to the process equipment 2 after the substrate S is temporarily stayed within the loadlock chamber 106 so as to perform the process. After the process is completed, the substrate S is unloaded from the process equipment 2 and then is temporarily stayed within the loadlock chamber 106. The transfer chamber 102, the cleaning chambers 108a and 108b, the buffer chamber 110, and the epitaxial chambers 112a, 112b, and 112c are maintained in a vacuum state. The loadlock chamber 106 is switched into a vacuum or atmospheric state. The loadlock chamber 106 prevents external contaminants from being introduced into the transfer chamber 102, the cleaning chambers 108a and 108b, the buffer chamber 110, and the epitaxial chambers 112a, 112b, and 112c. Also, since the substrate S is not exposed to the atmosphere during the transfer of the substrate S, it may prevent an oxide from being grown on the substrate S.

Gate valves (not shown) are disposed between the loadlock chamber 106 and the transfer chamber 102 and between the loadlock chamber 106 and the EFEM 3. When the substrate S is transferred between the EFEM 3 and the loadlock chamber 106, the gate valve disposed between the loadlock chamber 106 and the transfer chamber 102 is closed. Also, when the substrate S is transferred between the loadlock chamber 106 and the transfer chamber 102, the gate valve disposed between the loadlock chamber 106 and the EFEM 3 is closed.

A substrate handler 104 is disposed in the transfer chamber 102. The substrate handler 104 transfers the substrate S between the loadlock chamber 106, the cleaning chamber 108a and 108b, the buffer chamber 110, and the epitaxial chambers 112a, 112b, and 112c. The transfer chamber 102 is sealed so that the transfer chamber 102 is maintained in the vacuum state when the substrate S is transferred. The maintenance of the vacuum state is for preventing the substrate S from being exposed to contaminants (e.g., $O_2$, particle materials, and the like).

The epitaxial chambers 112a, 112b, and 112c are provided to form an epitaxial layer on the substrate S. In the current embodiment, the three epitaxial chambers 112a, 112b, and 112c are provided. Since it takes a relatively long time to perform an epitaxial process when compared to that of a cleaning process, manufacturing yield may be improved through the plurality of epitaxial chambers. Unlike the current embodiment, four or more epitaxial chambers or two or less epitaxial chambers may be provided.

The cleaning chambers 108a and 108b are configured to clean the substrate S before the epitaxial process is performed on the substrate S within the epitaxial chambers 112a, 112b, and 112c. To successfully perform the epitaxial process, an amount of oxide remaining on the crystalline substrate should be minimized. If an oxygen content on a surface of the substrate S is too high, oxygen atoms may interrupt crystallographic disposition of materials to be deposited on a seed substrate, and thus, it may have a bad influence on the epitaxial process. For example, during the silicon epitaxial deposition, excessive oxygen on the crystalline substrate may displace silicon atoms from its epitaxial position by oxygen atom clusters in atom units. The local atom displacement may cause errors in follow-up atom arrangement when a layer is more thickly grown. This phenomenon may be so-called stacking faults or hillock defects. Oxygenation on a surface of a substrate may, for example, occur when the substrate is exposed to the atmosphere while the substrate is transferred. Thus, the cleaning process for removing a native oxide (or a surface oxide) formed on the substrate S may be performed within the cleaning chambers 108a and 108b.

The cleaning process may be a dry etching process using hydrogen (H*) and $NF_3$ gases having a radical state. For example, when the silicon oxide formed on a surface of a substrate is etched, the substrate is disposed within a chamber, and then, the chamber has a vacuum atmosphere therein to generate an intermediate product reacting with the silicon oxide within the chamber.

For example, when reaction gases such as a hydrogen radical gas (H*) and a fluoride gas (for example, nitrogen fluoride ($NF_3$)) are supplied into the chamber, the reaction gases are reduced as expressed in the following reaction formula (1) to generate an intermediate product such as $NH_xF_y$ (where x and y are certain integers).

$$H^* + NF_3 \Rightarrow NH_xF_y \quad (1)$$

Since the intermediate product has high reactivity with silicon oxide ($SiO_2$), when the intermediate product reaches a surface of the silicon substrate, the intermediate product selectively reacts with the silicon oxide to generate a reaction product (($NH_4)_2SiF_6$) as expressed in following reaction formula (2).

$$NH_xF_y + SiO_2 \Rightarrow (NH_4)_2SiF_6 + H_2O \quad (2)$$

Thereafter, when the silicon substrate is heated at a temperature of about 100° C. or more, the reaction product is pyrolyzed as expressed in following reaction formula (3) to form a pyrolyzed gas, and then, the pyrolyzed gas is evaporated. As a result, the silicon oxide may be removed from the surface of the substrate. As shown in the following reaction formula (3), the pyrolysis gas includes a gas containing fluorine such as an HF gas or a $SiF_4$ gas.

$$(NH_4)_2SiF_6 \Rightarrow NH_3 + HF + SiF_4 \quad (3)$$

As described above, the cleaning process may include a reaction process for generating the reaction product and a heating process for pyrolyzing the reaction product. The reaction process and the heating process may be performed at the same time within the cleaning chambers 108a and 108b. Alternatively, the reaction process may be performed within one of the cleaning chambers 108a and 108b, and the heating process may be performed within the other one of the cleaning chambers 108a and 108b.

The buffer chamber 110 provides a space in which substrates S, on which the cleaning process is completed, are stacked and a space in which substrate S, on which the epitaxial process is performed, are stacked. When the cleaning process is completed, the substrate S is transferred into the buffer chamber 110 and then stacked within the buffer chamber 110 before the substrate S is transferred into the epitaxial chambers 112a, 112b, and 112c. The epitaxial chambers 112a, 112b, and 112c may be batch type chambers in which a single process is performed on a plurality of substrates. When the epitaxial process is completed within the epitaxial chambers 112a, 112b, and 112c, substrates S on which the epitaxial process is performed are successively stacked within the buffer chamber 110. Also, substrates S on which the cleaning process is completed are successively stacked within the epitaxial chambers 112a, 112b, and 112c. Here, the substrates S may be vertically stacked within the buffer chamber 110.

Figure 2:
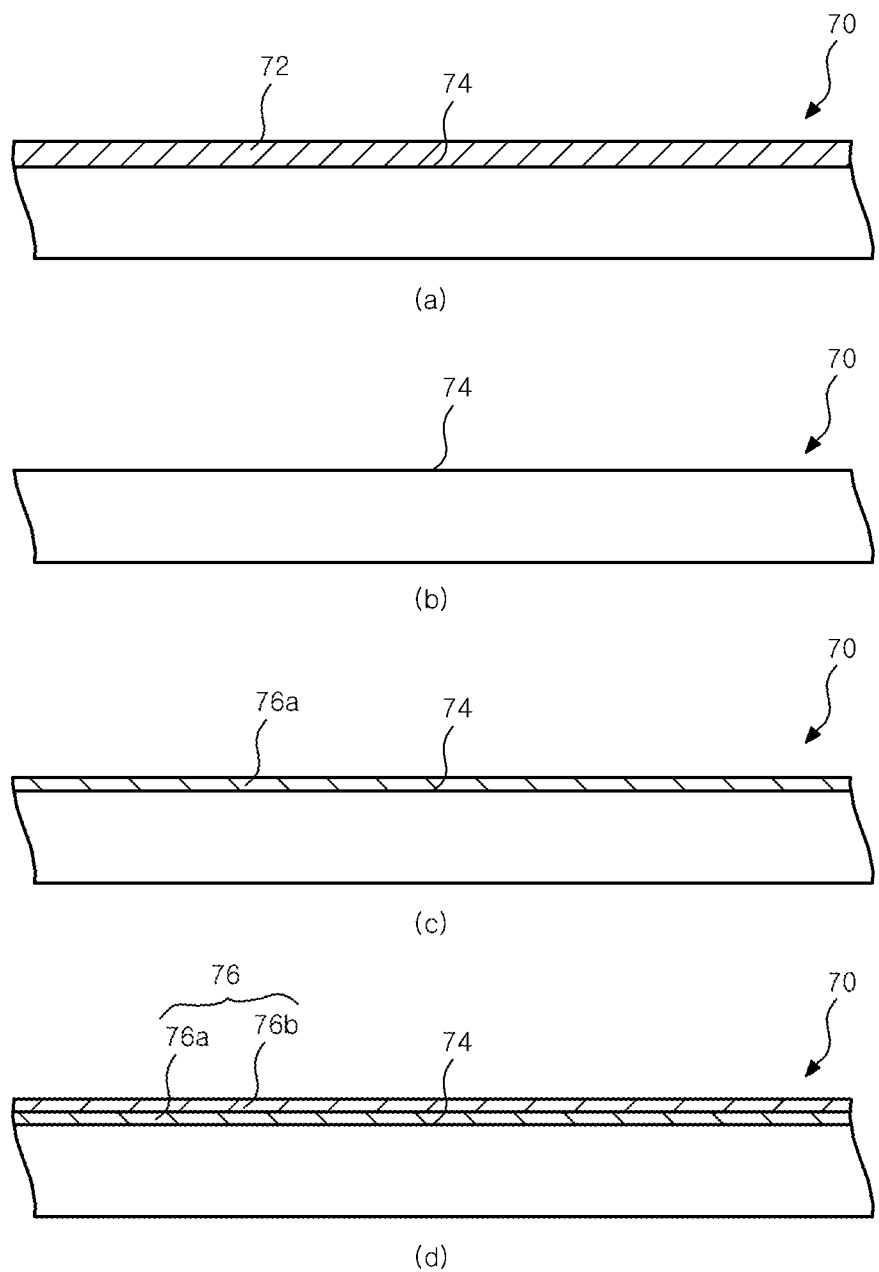
FIG. 2 is a view of a substrate that is treated according to an embodiment of the present invention.

FIG. 2 is a view of a substrate that is treated according to an embodiment of the present invention. As described above, the cleaning process is performed on the substrate S within the cleaning chambers 108a and 108b before the epitaxial process is performed on the substrate S. Thus, an oxide 72 formed on a surface of a substrate 70 may be removed through the cleaning process. The oxide 72 may be removed through the cleaning process within the cleaning chamber 108a and 108b. Also, an epitaxy surface 74 may be exposed on the surface of the substrate 70 through the cleaning process to assist growth of an epitaxial layer.

Thereafter, an epitaxial process is performed on the substrate 70 within the epitaxial chambers 112a, 112b, and 112c. The epitaxial process may be performed by chemical vapor deposition. The epitaxial process may be performed to form an epitaxial layer 76 on the epitaxy surface 74. The epitaxy surface 74 formed on the substrate 70 may be exposed to reaction gases including a silicon gas (e.g., $SiCl_4$, $SiHCl_3$, $SiH_2Cl_2$, $SiH_3Cl$, $Si_2H_6$, or $SiH_4$) and a carrier gas (e.g., $N_2$ and/or $H_2$). Also, when the epitaxial layer 76 is required to include a dopant, a silicon-containing gas may include a dopant-containing gas (e.g., $AsH_3$, $PH_3$, and/or $B_2H_6$).

Figure 3:
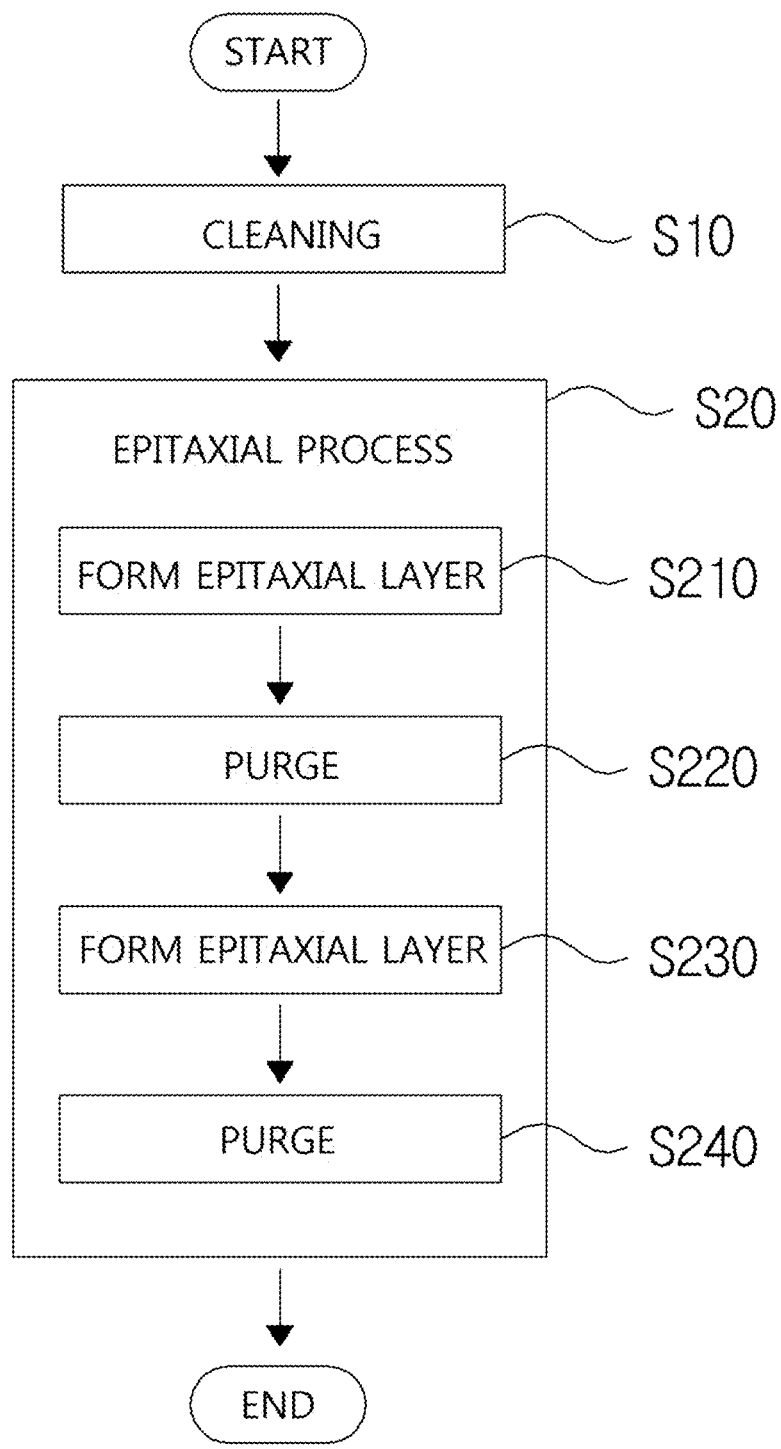
FIG. 3 is a flowchart illustrating a process of forming an epitaxial layer according to an embodiment of the present invention.
Figure 4:
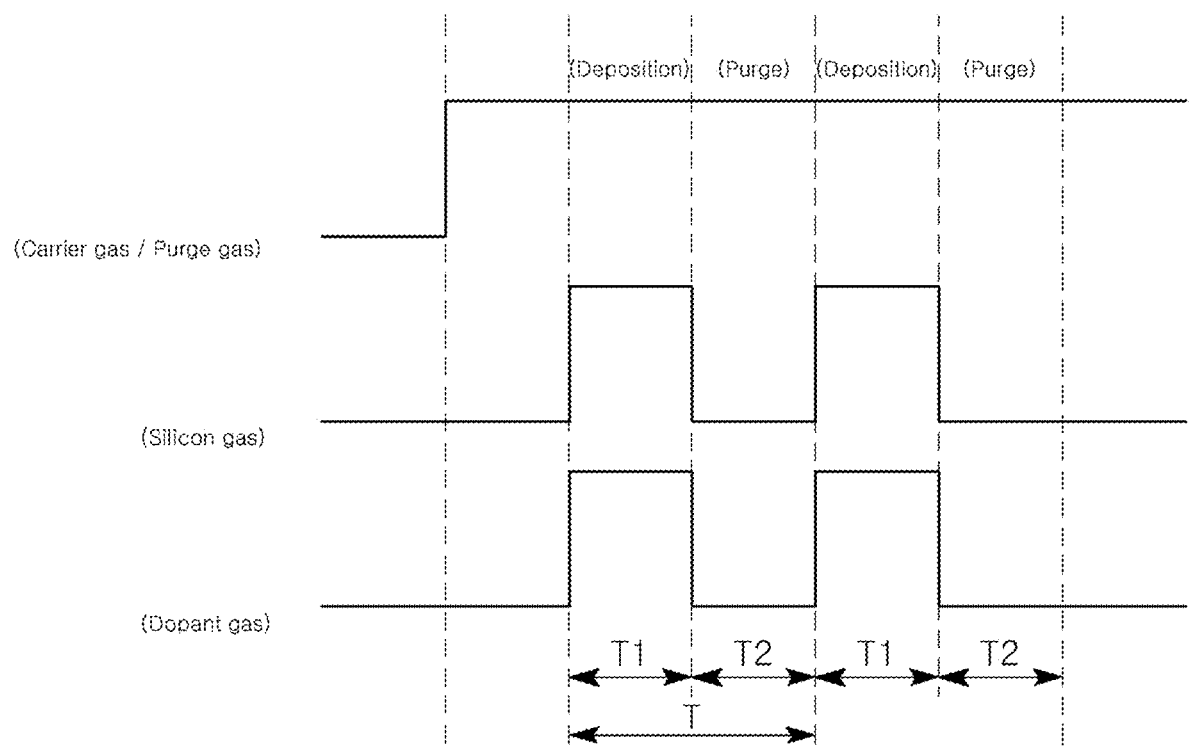
FIG. 4 is a graph illustrating the process of forming the epitaxial layer according to whether a gas is supplied according to an embodiment of the present invention.

FIG. 3 is a flowchart illustrating a process of forming an epitaxial layer according to an embodiment of the present invention, and FIG. 4 is a graph illustrating the process of forming the epitaxial layer according to whether a gas is supplied according to an embodiment of the present invention. In operation S10, a substrate S is transferred into cleaning chambers 108a and 108b before an epitaxial process is performed on the substrate S. Here, a substrate handler 104 transfers the substrate S into the cleaning chambers 108a and 108b. The transfer of the substrate S is performed through a transfer chamber 102 in which a vacuum state is maintained. A cleaning process is performed on the substrate S in the cleaning chambers 108a and 108b. As described above, the cleaning process includes a reaction process for generating a reaction product and a heating process for pyrolyzing the reaction product. The reaction process and the heating process may be performed at the same time within the cleaning chambers 108a and 108b. Alternatively, the reaction process may be performed within one of the cleaning chambers 108a and 108b, and the heating process may be performed within the other one of the cleaning chambers 108a and 108b.

In operation S20, the substrate S is transferred into epitaxial chambers 112a, 112b, and 112c. The transfer of the substrate S is performed through the transfer chamber 102 in which the vacuum state is maintained. AN epitaxial layer may be formed on the substrate in each of the epitaxial chambers 112a, 112b, and 112c. Thereafter, the process is ended.

In more detail, in operation S210, the substrate S is heated at a temperature of about 620° C. within the epitaxial chamber, and a pressure within the epitaxial chamber is adjusted to about 100 Torr. Thereafter, the reaction gas is injected into the chamber. Here, the reaction gas may include a silicon gas (e.g., $SiCl_4$, $SiHCl_3$, $SiH_2Cl_2$, $SiH_3Cl$, $Si_2H_6$, or $SiH_4$) and a carrier gas (e.g., $N_2$ and/or $H_2$) (for example, $SiH_4$ 50 sccm and $N_2$ 20 slm).

When the reaction gas is injected into the chamber, the silicon gas may be decomposed by thermal energy to generate semiconductor atoms. For example, when a monosilane gas is injected into the chamber, the monosilane gas is decomposed into silicon atoms and hydrogen atoms. The decomposed silicon atoms are bonded to dangling bonds on the surface of the substrate S and then adsorbed. Thus, the silicon atoms may be adsorbed on the surface of the substrate S to form a seed layer, and then an epitaxial layer (about 15 Å) may be formed on the substrate S. In addition, unreacted atoms may exist on the surface of the substrate (S).

When the epitaxial layer is formed through the above-described method, the epitaxial layer may not have a pre-determined thickness or more. Here, this is called a critical epitaxy thickness. That is, when the epitaxial layer is formed at a temperature of about 700° C. or less, the epitaxial layer may be damaged at a predetermined thickness or more to form an amorphous silicon layer. Here, the critical thickness represents an upper limit value of a thickness that is capable of being formed.

On the other hand, as described below, when the epitaxial layer formation process is divided into several processes to repeatedly perform "formation" and "purge", the damage of the epitaxial layer may be prevented to increase the critical thickness.

In operation S220, a purge gas is injected into the chamber (for example, about N23 slm or more, preferably, about 20 slm), and the purge gas purges the reaction gas and the unreacted atoms, which exist in the chamber. Also, in operation S220, the substrate S is thermally treated (for example, at a temperature of about 520° C. or more, preferably, about 620° C.).

Thereafter, in operation S230, the substrate S is reheated at a temperature of about 680° C. or less within the epitaxial chamber, and a pressure within the epitaxial chamber is adjusted again to about 300 Torr. Then, the reaction gas is re-injected into the chamber. Here, the reaction gas may include a silicon gas (e.g., $SiCl_4$, $SiHCl_3$, $SiH_2Cl_2$, $SiH_3Cl$, $Si_2H_6$, or $SiH_4$) and a carrier gas (e.g., $N_2$ and/or $H_2$). Thus, the silicon atoms may be adsorbed to the surface of the formed epitaxial layer to additionally form an epitaxial layer. In addition, unreacted atoms may exist on the surface of the substrate (S).

In operation S240, a purge gas is injected into the chamber, and the purge gas purges the reaction gas and the unreacted atoms, which exist in the chamber. Also, in operation S240, the substrate S is thermally treated.

In the epitaxial process according to this embodiment, although each of the epitaxial layer formation (S210 and S230) and the purge (S220 and S240) is performed two times, the present invention is not limited thereto. For example, in the epitaxial process, each of the epitaxial layer formation and the purge may be performed three times or more according to a desired thickness of the epitaxial layer.

Figure 5:
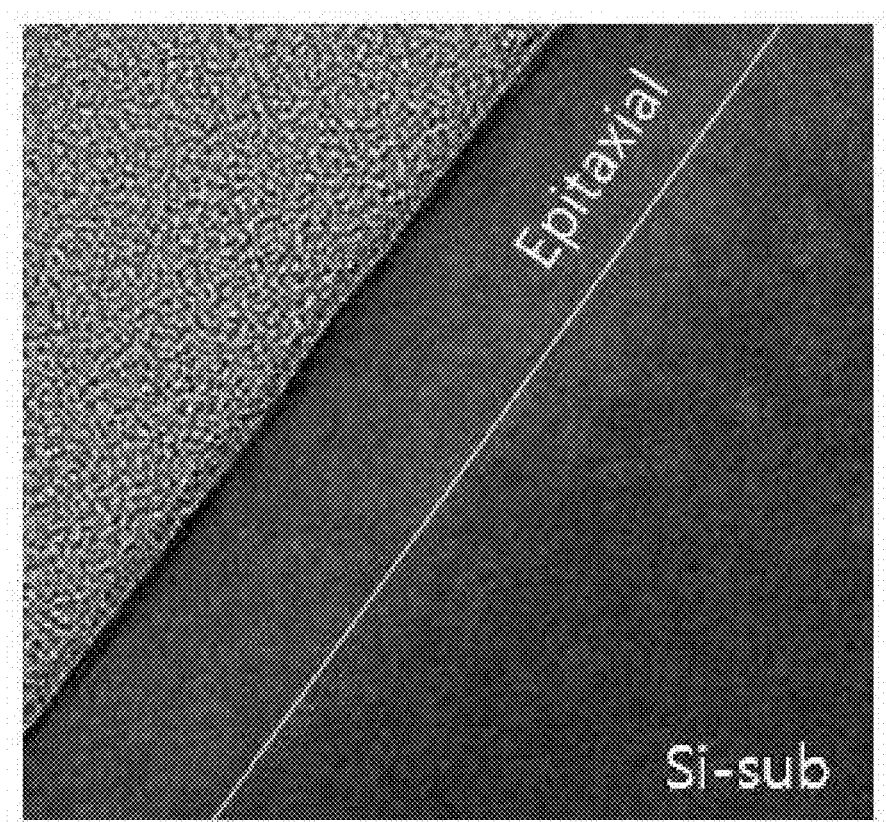
FIG. 5 is a photograph illustrating the epitaxial layer according to an embodiment of the present invention.
Figure 6:
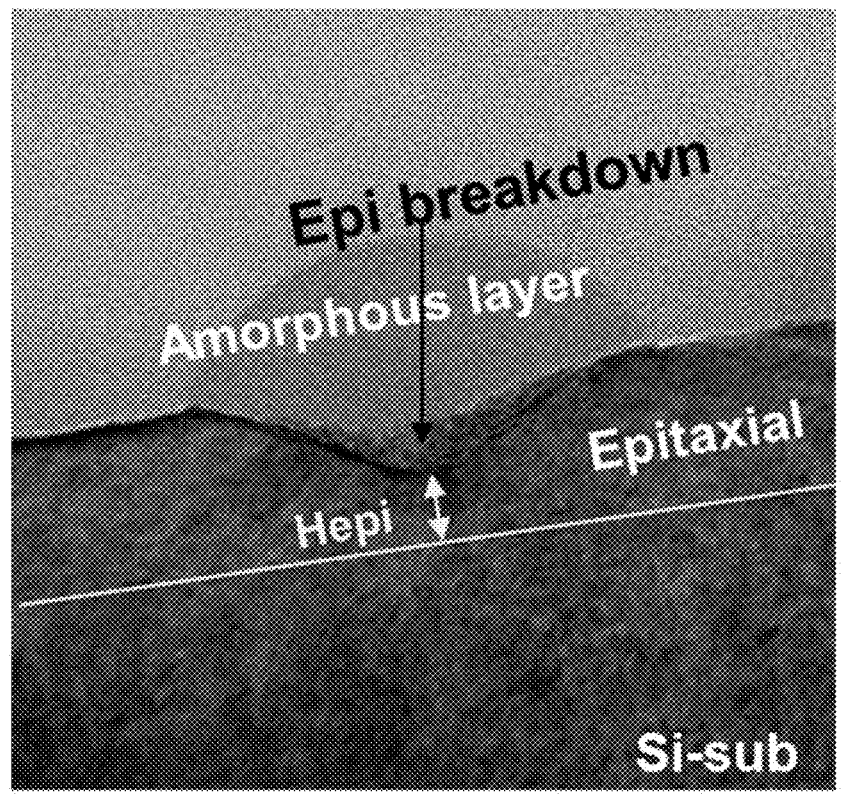
FIG. 6 is a photograph illustrating an epitaxial layer according to the related art.

FIG. 5 is a photograph illustrating the epitaxial layer according to an embodiment of the present invention, and FIG. 6 is a photograph illustrating an epitaxial layer according to the related art. FIGS. 5 and 6 illustrate epitaxial layers having substantially the same thickness (about 1,000 Å). Referring to FIG. 5, when the epitaxial layer formation and the purge are repeatedly performed to form an epitaxial layer having a predetermined thickness, it is seen that the epitaxial layer is not damaged at all. Referring to FIG. 5, when the epitaxial layer formation is continuously performed without performing the purge to form an epitaxial layer having a predetermined thickness, it is seen that the epitaxial layer is damaged.

Figure 7:
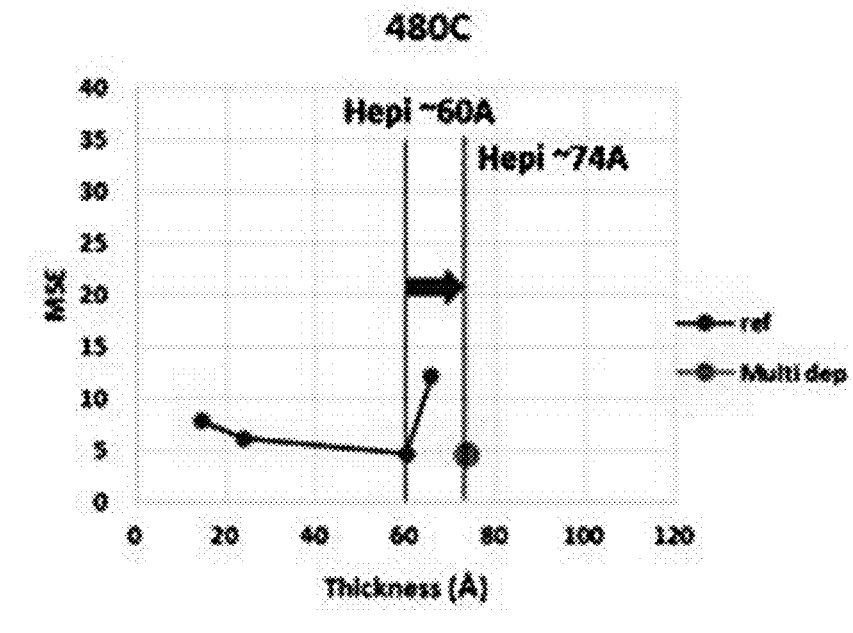
FIG. 7 is a graph illustrating results of increasing a critical thickness at a temperature of about 480° C. through a method for forming the epitaxial layer according to an embodiment of the present invention.
Figure 8:
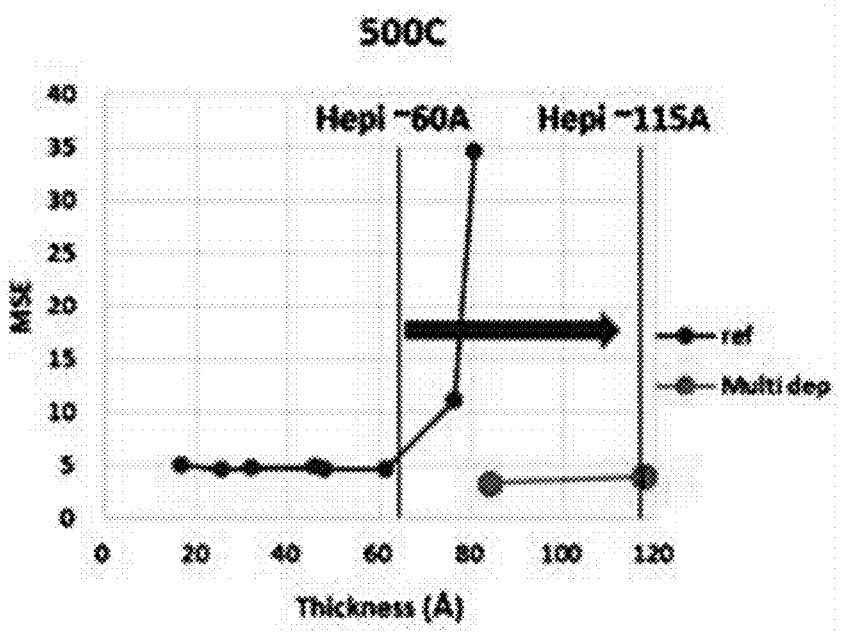
FIG. 8 is a graph illustrating results of increasing the critical thickness at a temperature of about 500° C. through the method for forming the epitaxial layer according to an embodiment of the present invention.
Figure 9:
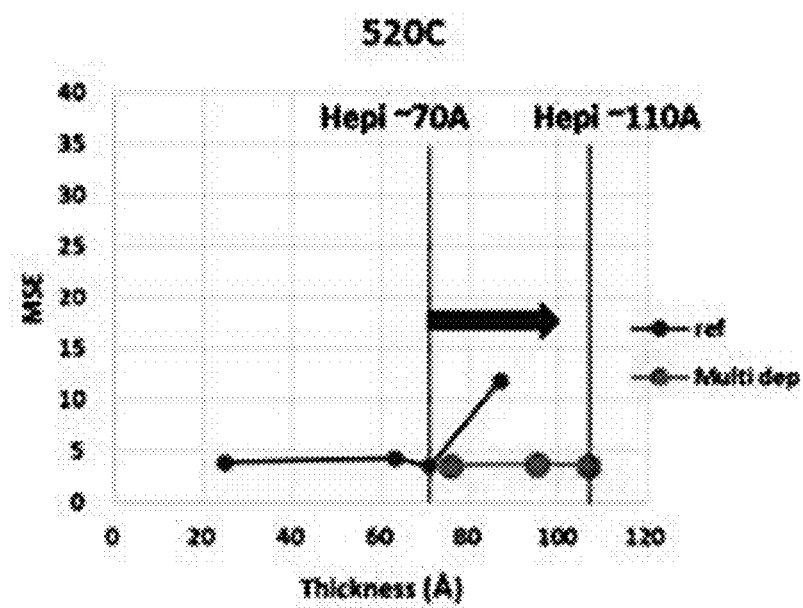
FIG. 9 is a graph illustrating results of increasing the critical thickness at a temperature of about 520° C. through the method for forming the epitaxial layer according to an embodiment of the present invention.

FIGS. 7 to 9 are graphs illustrating results of increasing a critical thickness through the method for forming the epitaxial layer according to an embodiment of the present invention. Referring to FIG. 7, it is seen that the critical thickness increases from about 60 Å to about 74 Å (when an epitaxial layer formation temperature is about 480° C.). Referring to FIG. 8, it is seen that the critical thickness increases from about 62 Å to about 115 Å (when an epitaxial layer formation temperature is about 500° C.). Referring to FIG. 9, it is seen that the critical thickness increases from about 70 Å to about 110 Å (when an epitaxial layer formation temperature is about 480° C.).

Figure 10:
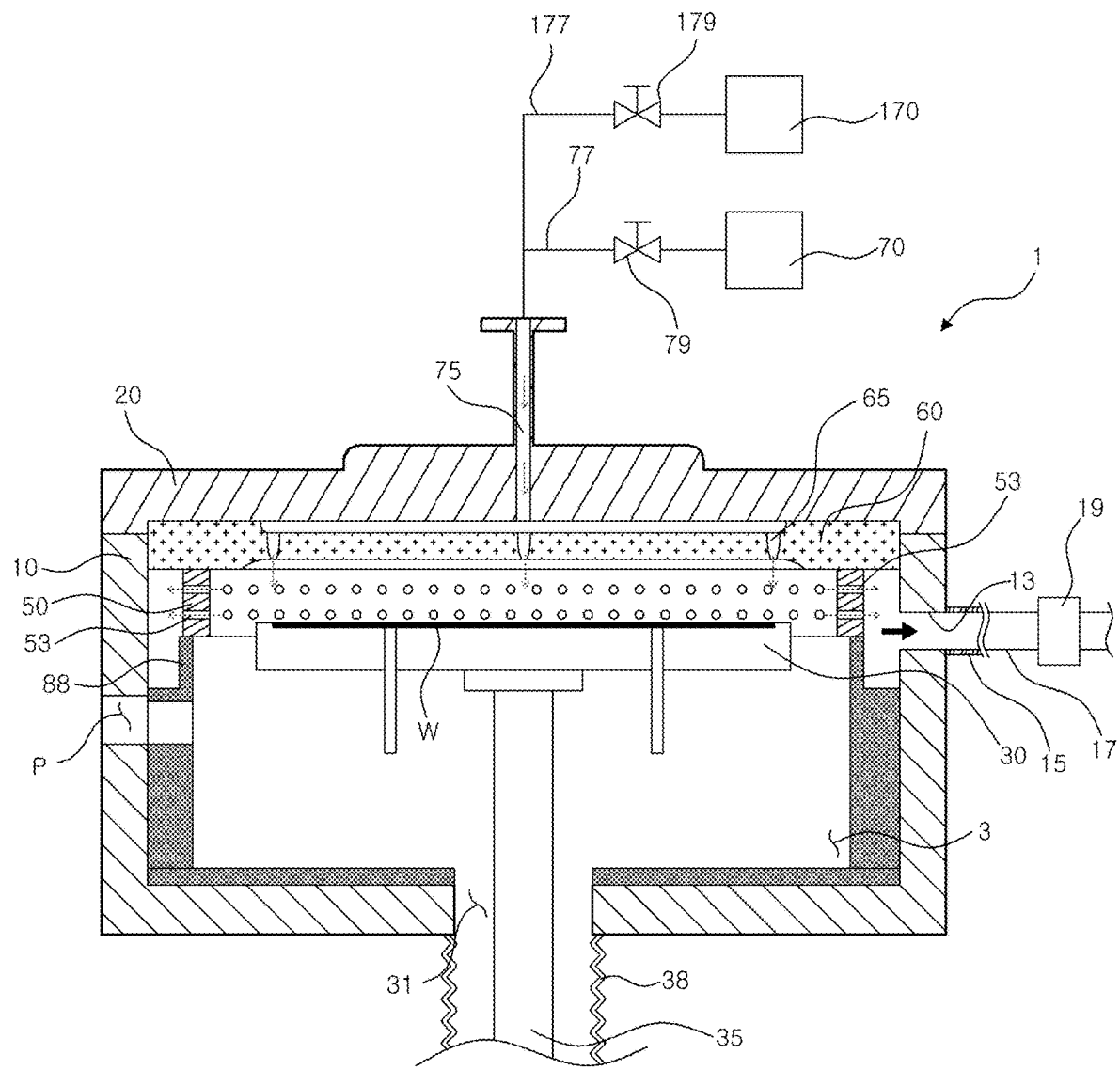
FIG. 10 is a schematic view of an epitaxial layer formation apparatus according to an embodiment of the present invention.

FIG. 10 is a schematic view of an epitaxial layer formation apparatus according to an embodiment of the present invention. Referring to FIG. 10, an epitaxial layer formation apparatus 1 includes a main chamber 10 and a chamber cover 20. The main chamber 10 may have a shape of which an upper portion is opened. A passage P through which the substrate S is accessible may be provided in one side of the main chamber 10. The substrate W may be loaded into and unloaded from the main chamber 10 through the passage P provided in the one side of the main chamber 10. The gate valve (not shown) may be installed outside the passage, and the passage may be opened or closed by the gate valve.

The chamber cover 20 is connected to the opened upper portion of the main chamber 10 to define a process space 3 that is shielded from the outside. A sealing member (not shown) may be installed between the main chamber 10 and the chamber cover 20 to completely seal the process space 3. A gas supply hole 75 passes through a ceiling wall of the chamber cover 20. Also, a reaction gas is supplied into the main chamber 10 through a reaction gas supply tube 77, and a carrier/purge gas is supplied into the main chamber 10 through a carrier/purge gas supply tube 177. The reaction gas supply tube 77 is connected to a reaction gas storage tank 70 to open or close a valve 79, thereby adjusting an amount of process gas to be injected. The carrier/purge gas supply tube 177 is connected to a gas storage tank 170 to open or close a valve 179, thereby adjusting an amount of carrier/purge gas to be injected.

A showerhead 60 having a plurality of diffusion holes 65 is installed on a lower end of the chamber cover 20. The showerhead 60 may uniformly supply the reaction gas and the carrier/purge gas onto the substrate W through the plurality of diffusion holes 65 defined at the same height. The showerhead 60 diffuses the reaction gas supplied through the gas supply hole 75 onto the substrate W. The gas supplied through the showerhead 60 may be exhausted through an exhaust passage 13 provided in the other side of the main chamber 10 after performing a predetermined process.

A heater 30 is installed in the process space 3 of the epitaxial layer formation apparatus 1. The heater 30 may receive current from an external power source (not shown) to generate heat. A seat groove (not shown) on which the substrate W is loaded and seated may be defined in a top surface of the heater 30. The heater 30 may have a circular disk shape corresponding to that of the substrate W to uniformly heat the substrate W. Also, the heater 30 may have a surface area greater than that of the substrate W. A through-hole 31 is defined in a lower central portion of the heater 30. A support shaft 35 is connected to a lower portion of the heater 30 to support the heater 30. The support shaft 35 may be connected to a driving unit (not shown) to rotate together with the hater 30.

Also, the epitaxial layer formation apparatus 1 may further include a bellows 38 in the process space. When the substrate W is treated, the bellows 38 maintains an internal atmosphere to a vacuum state and block an external atmosphere of the epitaxial layer formation apparatus 1. The bellows 38 may be compressible and elongatable and have an annular shape.

Also, the bellows 38 is disposed to surround the support shaft 35.

As illustrated in FIG. 10, a support member 88 is installed to be fixed to a sidewall of the main chamber 10. An exhaust ring 50 may be disposed between the showerhead 60 and the support member 88 and supported by the support member 88. The exhaust ring 50 is installed to be spaced apart from inner sidewall of the main chamber 10, and an exhaust space is defined between the exhaust ring 50 and the inner sidewall of the main chamber 10. The exhaust passage is provided in the sidewall of the main chamber 10 to communicate with the exhaust space, and an exhaust port 15 and an exhaust line 17 are connected to the exhaust passage 13. Thus, the unreacted gas and the byproducts generated when a thin film is formed may be forcibly suctioned through an exhaust pump 19 installed in the exhaust line 17 to move to the exhaust space through a plurality of exhaust holes 53 defined in the exhaust ring 50 and then exhausted to the outside through the exhaust passage 13, the exhaust port 15, and the exhaust line 17.

Although the present invention is described in detail with reference to the exemplary embodiments, the invention may be embodied in many different forms. Thus, technical idea and scope of claims set forth below are not limited to the preferred embodiments.

What is claimed is:

1. A method for forming an epitaxial layer, the method comprising:
   transferring a substrate into an epitaxial chamber; and
   performing an epitaxial process on the substrate to form an epitaxial layer on the substrate,
   wherein the epitaxial process comprises:
   heating the substrate at a temperature of about 700° C. or less and injecting a silicon gas into the epitaxial chamber in a state in which the inside of the epitaxial chamber is adjusted to a pressure of about 300 Torr or less to form a first epitaxial layer;
   stopping the injection of the silicon gas and injecting a purge gas into the epitaxial chamber to perform first purge inside the epitaxial chamber;
   heating the substrate at a temperature of about 700° C. or less and injecting the silicon gas into the epitaxial chamber in the state in which the inside of the epitaxial chamber is adjusted to a pressure of about 300 Torr or less to form a second epitaxial layer; and
   stopping the injection of the silicon gas and injecting the purge gas into the epitaxial chamber to perform second purge inside the epitaxial chamber, wherein,
   in the forming of the first and second epitaxial layers, the substrate is heated at a temperature of about 480, and
   in the epitaxial process, the epitaxial layer having a thickness that is greater than about 60 Å and less than about 74 Å is formed on the substrate.

2. The method of claim 1, wherein the silicon gas comprises at least one of $SiCl_4$, $SiHCl_3$, $SiH_2Cl_2$, $SiH_3Cl$, $Si_2H_6$, and $SiH_4$.

3. The method of claim 1, wherein the epitaxial process further comprises:
   heating the substrate at a temperature of about 700° C. or less and injecting the silicon gas into the epitaxial chamber in the state in which the inside of the epitaxial chamber is adjusted to a pressure of about 300 Torr or less to form an n-th epitaxial layer; and
   stopping the injection of the silicon gas and injecting the purge gas into the epitaxial chamber to perform n-th purge inside the epitaxial chamber (where n=3, 4, . . . k, and k is an integer).

4. A method for forming an epitaxial layer, the method comprising:
   transferring a substrate into an epitaxial chamber; and
   performing an epitaxial process on the substrate to form an epitaxial layer on the substrate,
   wherein the epitaxial process comprises:
   heating the substrate at a temperature of about 700° C. or less and injecting a silicon gas into the epitaxial chamber in a state in which the inside of the epitaxial chamber is adjusted to a pressure of about 300 Torr or less to form a first epitaxial layer;
   stopping the injection of the silicon gas and injecting a purge gas into the epitaxial chamber to perform first purge inside the epitaxial chamber;
   heating the substrate at a temperature of about 700° C. or less and injecting the silicon gas into the epitaxial chamber in the state in which the inside of the epitaxial chamber is adjusted to a pressure of about 300 Torr or less to form a second epitaxial layer; and
   stopping the injection of the silicon gas and injecting the purge gas into the epitaxial chamber to perform second purge inside the epitaxial chamber, wherein,
   in the forming of the first and second epitaxial layers, the substrate is heated at a temperature of about 500, and
   in the epitaxial process, the epitaxial layer having a thickness that is greater than about 62 Å and less than about 115 Å is formed on the substrate.

5. A method for forming an epitaxial layer, the method comprising:
   transferring a substrate into an epitaxial chamber; and
   performing an epitaxial process on the substrate to form an epitaxial layer on the substrate,
   wherein the epitaxial process comprises:
   heating the substrate at a temperature of about 700° C. or less and injecting a silicon gas into the epitaxial chamber in a state in which the inside of the epitaxial chamber is adjusted to a pressure of about 300 Torr or less to form a first epitaxial layer;
   stopping the injection of the silicon gas and injecting a purge gas into the epitaxial chamber to perform first purge inside the epitaxial chamber;
   heating the substrate at a temperature of about 700° C. or less and injecting the silicon gas into the epitaxial chamber in the state in which the inside of the epitaxial chamber is adjusted to a pressure of about 300 Torr or less to form a second epitaxial layer; and
   stopping the injection of the silicon gas and injecting the purge gas into the epitaxial chamber to perform second purge inside the epitaxial chamber, wherein,
   in the forming of the first and second epitaxial layers, the substrate is heated at a temperature of about 520, and
   in the epitaxial process, the epitaxial layer having a thickness that is greater than about 71 Å and less than about 110 Å is formed on the substrate.

* * * * *